(12) United States Patent
Zhu et al.

(10) Patent No.: US 7,943,467 B2
(45) Date of Patent: May 17, 2011

(54) STRUCTURE AND METHOD TO FABRICATE MOSFET WITH SHORT GATE

(75) Inventors: Huilong Zhu, Poughkeepsie, NY (US); Brian J. Greene, Wappingers Falls, NY (US); Yanfeng Wang, Fishkill, NY (US); Daewon Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 446 days.

(21) Appl. No.: 12/016,317

(22) Filed: Jan. 18, 2008

(65) Prior Publication Data

US 2009/0184378 A1 Jul. 23, 2009

(51) Int. Cl.
*H01L 21/336* (2006.01)

(52) U.S. Cl. ........ 438/283; 438/197; 438/201; 438/592; 257/288; 257/401; 257/901; 257/384; 257/385

(58) Field of Classification Search .................. 438/303, 438/157, 233, 283, 197, 201, 199, 592; 257/E29.255, E21.177, 387, 288, 401, 901, 257/384, 385, 282
See application file for complete search history.

(56) References Cited

U.S. PATENT DOCUMENTS

| 2005/0048732 | A1 | 3/2005 | Park et al. | |
|---|---|---|---|---|
| 2005/0191833 | A1* | 9/2005 | Chang et al. | 438/586 |

FOREIGN PATENT DOCUMENTS

| CN | 1294648 C | 1/2007 |
|---|---|---|
| CN | 101159232 A | 4/2008 |

\* cited by examiner

*Primary Examiner* — Thao X Le
*Assistant Examiner* — Thanh Y Tran
(74) *Attorney, Agent, or Firm* — Scully, Scott, Murphy & Presser, P.C.; H. Daniel Schnurmann

(57) ABSTRACT

A method of producing a semiconducting device is provided that in one embodiment includes providing a semiconducting device including a gate structure atop a substrate, the gate structure including a dual gate conductor including an upper gate conductor and a lower gate conductor, wherein at least the lower gate conductor includes a silicon containing material; removing the upper gate conductor selective to the lower gate conductor; depositing a metal on at least the lower gate conductor; and producing a silicide from the metal and the lower gate conductor. In another embodiment, the inventive method includes a metal as the lower gate conductor.

15 Claims, 4 Drawing Sheets

US 7,943,467 B2

STRUCTURE AND METHOD TO FABRICATE MOSFET WITH SHORT GATE

FIELD OF THE INVENTION

In one embodiment, the present invention relates to semiconducting structures and devices.

BACKGROUND OF THE INVENTION

As feature size of transistors is scaled down, it is not only the size of electrodes (source, drain, and gate) that become smaller, but also the distance between the electrodes that becomes smaller. The close proximity of adjacent electrodes increases the electric field between the electrodes during operation. For overall integrated circuit performance, it is desirable to minimize parasitic capacitance, while maximizing drive currents without increasing the off-state leakage of the device.

The height of gate structures effects the parasitic capacitance between the gate and the source and drain (S/D) contact structure, as well as the extension doping regions that overlap with the gate and S/D contact structure. The reduction of gate height decreases the peripheral components of outer-fringe capacitance between the gate line and the source/drain electrodes.

However, complementary metal oxide semiconductor (CMOS) processing with self-aligned source/drain/gate implantation limits the amount by which the gate height can be reduced, since implanting dopants using gate structures as a mask to provide the source/drain and halo regions of the device can cause the dopants to penetrate through the gate structures into the channel. Therefore, as the gate height is decreased, the risk of a gate impurity contaminating the underlying gate dielectric increases.

SUMMARY OF THE INVENTION

The present invention, in one embodiment provides a method of fabricating a semiconducting device having a gate formed from a metal semiconductor alloy. In one embodiment, the inventive method includes:
providing a semiconducting device including a gate structure atop a substrate, the gate structure comprising a dual gate conductor including an upper gate conductor and a lower gate conductor, wherein at least the lower gate conductor is composed of a silicon containing material;
removing the upper gate conductor selective to the lower gate conductor;
depositing a metal on at least the lower gate conductor; and
forming a metal semiconductor alloy from the metal and the lower gate conductor.

In one embodiment, the semiconducting device that is provided in the initial steps of the present method includes activated source and drain regions within the substrate. In one embodiment, the gate structure includes a sacrificial dielectric layer positioned between the upper gate conductor and the lower gate conductor, a gate dielectric positioned between the lower gate conductor and the substrate, and at least one dielectric spacer adjacent to the sidewalls of the dual gate conductor. In one embodiment, the lower gate conductor of the dual gate conductor is composed of polysilicon. In one embodiment, the gate dielectric of the dual gate conductor is composed of an oxide and the at least one dielectric spacer is composed of a nitride.

In one embodiment of the present method, the step of removing the upper gate conductor includes forming a contact metal layer on the upper surface of the semiconducting device, forming a metal nitride layer on the contact metal layer, removing at least a portion of the metal nitride layer and a portion of the contact metal layer overlying the gate structure, as well as a portion of the upper gate conductor with a substantially anisotropic and substantially non-selective material removal process, and removing a remaining portion of the upper gate conductor to expose the lower gate conductor. In one embodiment, the substantially non-selective and substantially anisotropic material removal process includes ion milling. In one embodiment, removing the remaining portion of the upper gate conductor and the sacrificial dielectric layer includes an etch process that includes removing the remaining portion of the upper gate conductor selective to the sacrificial dielectric layer, and removing the sacrificial dielectric layer selective to the lower gate conductor. In one embodiment, in which the remaining portion of the upper gate conductor is composed of polysilicon and the sacrificial dielectric layer is composed of an oxide, removing the remaining portion of the upper gate conductor selective to the sacrificial dielectric layer includes a reactive ion etch process having an etch chemistry that removes polysilicon selective to oxide. In one embodiment, in which the sacrificial dielectric layer is composed of oxide and the lower gate conductor is composed of polysilicon, removing the sacrificial dielectric layer selective to the lower gate conductor includes a reactive ion etch process having an etch chemistry that removes oxide selective to polysilicon.

In one embodiment, forming the contact metal layer and the metal nitride layer includes a deposition process, such as physical vapor deposition, e.g., sputter deposition, or chemical vapor deposition. In one embodiment, the contact metal layer is composed of Ni, and the metal nitride layer is composed of TiN.

In one embodiment, the metal that is deposited on the exposed lower gate conductor may be composed of Ni, Co, Ti, or Pt. In one embodiment, the silicide formed from the deposited metal includes NiSi, $NiSi_2$, NiPtSi, $TiSi_2$, $CoSi_2$, $MoSi_2$, $PtSi_2$, $TaSi_2$, or WSi. In one embodiment, producing the metal semiconductor alloy from the metal and the lower gate conductor includes an annealing step. In one embodiment when the polysilicon lower gate conductor is converted to $NiSi_2$, the annealing step includes applying a temperature of approximately 300° C. to approximately 500° C. for a time period ranging from about 1 seconds to about 30 seconds. In one embodiment, the metal semiconductor alloy is provided by a silicidation process. In one embodiment, the method further includes a wet etch step following alloying of the lower gate conductor with the metal that was deposited atop the lower gate conductor to remove the unreacted metal, such as the TiN and Ni.

In another aspect of the present invention, a method is provided for producing a semiconducting device having a metal gate. In one embodiment, the method includes:
providing a semiconducting device including a substrate, a dual gate conductor atop the substrate, and dopant regions in the substrate substantially corresponding (e.g., self aligned) to sidewalls of the dual gate conductor, the dual gate conductor including an upper gate conductor and a lower gate conductor, wherein the lower gate conductor is a metal gate;
forming a contact metal layer on at least the dopant regions;
removing the upper gate conductor; and
producing a metal semiconductor alloy from the contact metal layer and the dopant regions.

In one embodiment, the dual gate conductor that is provided in the initial process steps of the present invention further includes a dielectric layer positioned between the upper gate conductor and the lower gate conductor and a gate dielectric positioned between the lower gate conductor and the substrate. In one embodiment, the dielectric layer is composed of an oxide.

In one embodiment, removing the upper gate conductor further includes forming a contact metal layer on the upper surface of the semiconducting device, forming a metal nitride layer on the contact metal layer, removing at least the portion of the metal nitride layer and contact metal layer that are overlying the gate structure, as well as a portion of the upper gate conductor, and removing the remaining portion of the upper gate conductor to expose the dielectric layer. In one embodiment, the substantially non-selective and substantially anisotropic material removal process includes ion milling. In one embodiment, the step of removing the remaining portion of the upper gate conductor to expose the dielectric layer includes an etch process that removes the remaining portion of the upper gate conductor selective to the dielectric layer. In one embodiment when the remaining portion of the upper gate conductor is composed of polysilicon and the dielectric layer is composed of an oxide, the etch step to remove the remaining portion of the upper gate conductor includes a reactive ion etch process having an etch chemistry for removing polysilicon selective to the dielectric layer.

In one embodiment, producing the silicide from the metal atop the dopant regions comprises annealing. In one embodiment when the metal comprises Ni, the step of forming the metal conductor alloy may include annealing at a temperature of approximately 300° C. to approximately 500° C.

In another aspect of the present invention, a semiconducting structure is provided having a gate conductor height ranging from about 20 nm to about 50 nm. In one embodiment, the gate conductor height is about 30 nm. In one embodiment, the semiconducting structure includes:
a substrate including a channel positioned between a source region and a drain region; and
a gate structure including a gate stack and at least one facetted spacer abutting the gate stack, the gate stack comprised of a gate dielectric positioned atop the channel of the substrate, and a gate conductor atop the gate dielectric, wherein the height of the at least one facetted spacer is greater than the height of the gate conductor.

In one embodiment, the gate conductor is composed of a metal or polysilicon or a metal semiconductor alloy. In one embodiment, the gate conductor has a height ranging from about 20 nm to about 50 nm. In one embodiment, the at least one facetted gate spacers have a height ranging from about 40 nm to about 100 nm. In one embodiment, the angle that at an intersection of a planar upper face of the at least one facetted spacer and a sidewall of the at least one facetted spacer that is in abutting relationship with the gate conductor is less than about 75 degrees. In another embodiment, the angle that at an intersection of a planar upper face of the at least one facetted spacer and a sidewall of the at least one facetted spacer that is in abutting relationship with the gate conductor is less than about 30 degrees.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
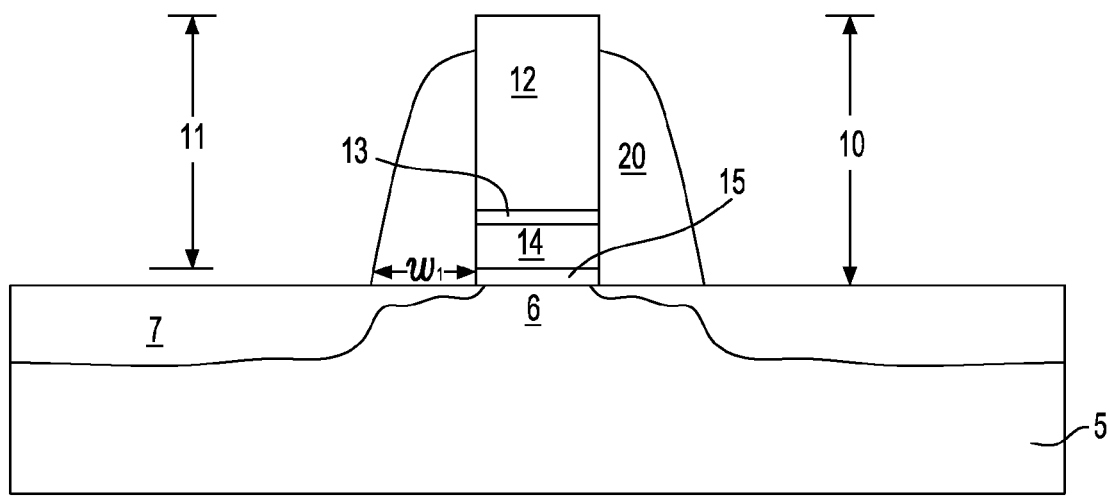
FIG. 1 is a side cross sectional view of an initial structure including a gate structure atop a semiconducting substrate, as used in accordance with at least one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods and structures relating to gate structures in semiconducting devices. When describing the inventive methods and structures, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor.

As used herein, a "P-type semiconductor" refers to the addition of trivalent impurities to an intrinsic semiconductor that creates deficiencies of valence electrons, such as the addition of boron, aluminum, or gallium to a type IV semiconductor, such as Si.

As used herein, an "N-type semiconductor" refers to the addition of pentavalent impurities to an intrinsic semiconductor that contribute free elections, such the addition of antimony, arsenic, or phosphorous to a type IV semiconductor, such as Si.

A "gate structure" means a structure used to control output current (i.e., flow of carriers in the channel) of a semiconducting device, such as a field effect transistor (FET).

As used herein, the term "dual gate conductor" denotes a gate region to a semiconducting device, such as a field effect transistor, that includes two gate conductors.

As used herein, the term "gate conductor" denotes a material having a conductivity ranging from 0.1 Ω/square to 20 Ω/square, which is positioned overlying a gate dielectric.

As used herein, a "metal" is an electrically conductive material, which in the metal atoms are held together by the force of a metallic bond, and the energy band structure of the metal's conduction and valence bands overlap, and hence, there is no energy gap.

As used herein, the term "polysilicon" denotes a material composed of multiple Si crystals.

A "silicide" is an alloy of a metal and silicon.

An "unreacted portion of a silicide" refers to portions of metal that has not alloyed with silicon in the formation of the silicide.

As used herein, the term "selective" in reference to the material removal processes denotes that the rate of material removal for a first material is greater than the rate of at least another material of the structure to which the material removal process is being applied.

As used herein, the term "non-selective" in reference to the material removal processes denotes that the rate of material removal for a first material is substantially the same as the other materials of the structure to which the material removal process is being applied.

As used herein, a "gate dielectric" is a layer of an insulator between the semiconductor device substrate and the gate conductor.

As used herein, "high K" denotes a dielectric material featuring a dielectric constant (k) higher than about 3.9.

As used herein, "dopant regions" refers to portions of an intrinsic semiconductor material in which the electrical conductivity of the material is dependent upon n-type or p-type dopants.

As used herein, "ion milling" denotes a substantially non-selective and anisotropic material removal process in which ions extracted from plasma are accelerated towards a target to be etched for the purpose of material removal from the target.

The term "anisotropic" denotes a material removal process in which the material removal rate in the direction normal to the surface of the material to be removed is greater than in the direction parallel to the surface of the material to be removed.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIGS. 1 to 6 depict one embodiment of the present method for forming a semiconducting device, such as a metal oxide semiconducting field effect transistor (MOSFET), including a silicide gate conductor. FIG. 1 depicts an initial structure for one embodiment of the present method, in which the initial structure may include a substrate 5 including source and drain regions 7 separated by a channel 6, and a gate structure 10 substantially overlying the channel 6 of the substrate 5, wherein the gate structure 10 includes a dual gate conductor 11, gate dielectric 15 and at least one spacer 20. In one embodiment, the dual gate conductor 11 includes an upper gate conductor 12 and a lower gate conductor 14, wherein the upper gate conductor 12 and the lower gate conductor 14 are separated by a sacrificial dielectric layer 13.

In one embodiment, the substrate 5 includes, but is not limited to: Si-containing materials, GaAs, InAs and other like semiconductors. Si-containing materials as used to provide the substrate 5 include, but are not limited to: Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In one embodiment in which the substrate 5 is a silicon-on-insulator (SOI) or SiGe-on-insulator (SGOI) substrate, the thickness of the Si-containing layer atop the buried insulating layer can have a thickness on the order of 10 nm or greater. In one embodiment, the SOI or SGOI substrate may be fabricated using a thermal bonding process, or in another embodiment may be fabricated by an ion implantation process.

Still referring to FIG. 1, the gate structure 10 may be formed atop the substrate 5 utilizing deposition and lithography processes. More specifically, in one embodiment, a gate structure 10 is provided atop the substrate 5 by depositing a gate dielectric layer followed by a lower gate conductor layer, sacrificial dielectric layer, and upper gate conductor layer to provide a gate stack. More specifically, the gate stack is composed of a dual gate conductor 11 atop a gate dielectric 15. In a following process step, the gate stack is patterned using photolithography and etch processes. For example, following the deposition of the gate dielectric layer, lower gate conductor layer, sacrificial dielectric layer, and upper gate conductor layer, an etch mask is formed atop the upper gate conductor layer protecting the portion of the layered stack that provides the gate stack, wherein the portions exposed by the etch mask are removed by an anisotropic etch process, such as a reactive ion etch. Reactive ion etch is a form of plasma etching, in which the surface to be etched is placed on the RF powered electrode and takes on a potential that accelerates an etching species, which is extracted from a plasma, towards the surface to be etched, wherein a chemical etching reaction takes place in the direction normal to the surface being etched. In one embodiment, the etch mask may be provided by a patterned photoresist layer. In a following process step, the spacers 20 may be formed abutting the gate stack.

In one embodiment, the gate dielectric 15 of the gate stack is composed of an oxide material. Suitable examples of oxides that can be employed as the gate dielectric 15 include, but are not limited to: $SiO_2$, $Al_2O_3$, $ZrO_2$, $HfO_2$, $Ta_2O_3$, $TiO_2$, perovskite-type oxides and combinations and multi-layers thereof. In a further embodiment, the gate dielectric 15 may also be composed of a nitride, oxynitride, or a combination (or multi layer) of oxide, nitride and oxynitride. In one embodiment, the gate dielectric 15 has a thickness greater than approximately 0.8 nm. In another embodiment, the gate dielectric 15 has a thickness ranging from about 1.0 nm to about 6.0 nm. In one embodiment, the gate dielectric 15 is formed using chemical vapor deposition (CVD) including, but not limited to: atomic layer CVD (ALCVD), pulsed CVD, plasma assisted CVD. In another embodiment, the gate dielectric 15 is formed by a thermal growing process, which may include oxidation, oxynitridation, nitridation, and/or plasma or radical treatment. In one embodiment, the gate dielectric 15 may be a high-k gate dielectric comprised of an insulating material having a dielectric constant of greater than about 3.9. In another embodiment, the gate dielectric 15 is a high-k gate dielectric comprised of an insulating material having a dielectric constant greater than 7.0. In one embodiment, a high-k gate dielectric is provided by $HfO_2$, hafnium silicate, hafnium silicon oxynitride or combinations thereof.

In one embodiment, the lower gate conductor 14 of the gate stack is composed of a silicon containing material, which may be polysilicon. In another embodiment, the lower gate conductor 14 is composed of single crystal Si, SiGe, SiGeC or combinations thereof. In another embodiment, the lower gate conductor may be a metal. In one embodiment, the lower gate conductor 14 is formed atop the gate dielectric 15 utilizing a deposition process, such as CVD and physical vapor deposition (PVD). In one embodiment, the lower gate conductor 14 is composed of a doped silicon containing material. The dopant can be elements from group ITT-A or group V of the Periodic Table of Elements. The dopant may be introduced during deposition of the lower gate conductor layer or following subsequent patterning and etching of the lower gate conductor 14. In one embodiment, the lower gate conductor 14 has a height ranging from about 20 nm to about 50 nm. In another embodiment, the lower gate conductor 14 has a height ranging from about 20 nm to about 40 nm. In a further embodiment, the lower gate conductor 14 has a height ranging from about 25 nm to about 35 nm.

In one embodiment, the sacrificial dielectric layer 13 of the gate stack is composed of and formed using any of the materials and formation methods that are described above with reference to the gate dielectric 15. For example, the sacrificial dielectric layer 13 may be a nitride, oxynitride, or a combination of oxide, nitride and oxynitride. In one embodiment, the sacrificial dielectric layer 13 may have a thickness greater than approximately 0.8 nm. In another embodiment, the sacrificial dielectric layer 13 may have a thickness ranging from about 1.0 nm to about 6.0 nm. It is noted that other materials and thicknesses are contemplated for the sacrificial dielectric layer 13, and are within the scope of the present invention, so long as the composition and thickness of the sacrificial dielectric layer 13 provides for etch selectivity in the removal of the upper gate conductor 12.

The upper gate conductor 12 of the gate stack may be composed of a silicon containing material or a metal. Examples of silicon containing materials that are suitable for the upper gate conductor include but are not limited to single crystal silicon, polysilicon, SiGe, SiGeC or combinations thereof. Examples of metals that may be suitable for the upper gate conductor include, but are not limited to: W, Cu, Al and alloys thereof. In one embodiment, the upper gate conductor 12 may be formed atop the sacrificial dielectric layer 13 utilizing a deposition process, such as CVD or PVD, e.g., sputtering. In one embodiment, the upper gate conductor 12 may be composed of doped polysilicon, wherein the polysilicon dopant can be elements from group III-A or a group V of the Periodic Table of Elements. In one embodiment, the upper gate conductor 12 has a height ranging from about 20 nm to about 100 nm. In another embodiment, the upper gate conductor 12 has a height ranging from about 30 nm to about 80 nm. In a further embodiment, the upper gate conductor 12 has a height ranging from about 40 nm to about 70 nm.

Still referring to FIG. 1, following the formation of the gate stack, at least one dielectric spacers 20, also referred to as a sidewall spacer, is formed abutting the gate stack sidewalls. In one embodiment, the at least one dielectric spacer 20 is a nitride, such as silicon nitride ($Si_3N_4$). In another embodiment, the at least one dielectric spacer 20 may be composed of an oxide. The sidewall spacer width W1 may ranges from about 10 nm to about 60 nm. In one embodiment, the dielectric spacers 20 may be provided by forming processes, such as deposition or thermal growth. In one embodiment, the at least one dielectric spacer 20 are formed by deposition processes, such as chemical vapor deposition (CVD) in combination with an anisotropic etch, such as reactive ion etch.

In a following process step, source/drain regions 7 are formed in substrate 5 corresponding to the sidewalls of the gate stack. In one embodiment, source/drain regions 7 are formed via ion implantation and comprise a combination of normally incident and angled implants to form the desired grading. In one embodiment, PFET devices are produced within Si-containing substrates by doping the source/drain regions 7 with elements from group III of the Periodic Table of Elements. In another embodiment, NFET devices are produced within Si-containing substrates by doping the source/drain regions 7 with elements from group V-A of the Periodic Table of Elements. It is noted that the substrate 5 may further include extension dopant regions and halo dopant regions, as well as additional spacers utilized in forming extension dopant regions. Although not depicted in the Figures, these regions are within the scope of the present invention.

Figure 2:
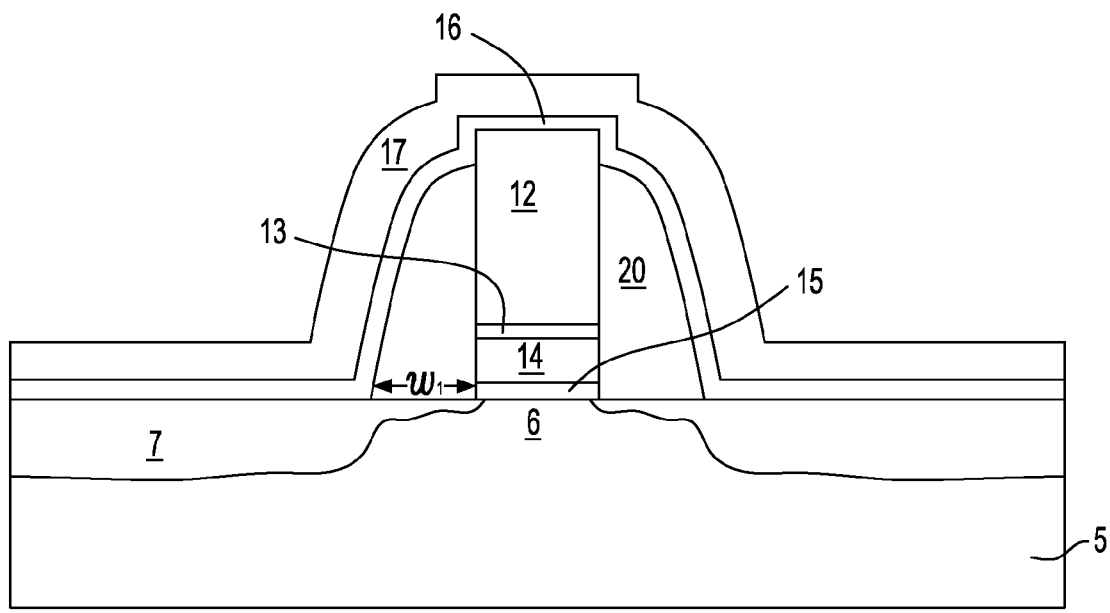
FIG. 2 is a side cross sectional view depicting depositing a first metal layer and a metal nitride layer atop the structure depicted in FIG. 1, in accordance with one embodiment of the present invention.

FIG. 2 depicts one embodiment of depositing a first metal layer 16 (also referred to as a contact metal layer) and a metal nitride layer 17 atop the structure depicted in FIG. 1. In one embodiment, the metal nitride layer 17, e.g., TiN, acts as a protection layer for NiSi during silicidation annealing. Specifically, in one embodiment, first metal layer 16 is formed atop the gate structure 10 including the upper gate conductor 12, the at least one dielectric spacer 20, as well as the exposed surface of the substrate 5 that are adjacent to the gate structure 10. In a following process step, the metal nitride layer 17 is deposited atop the first metal layer 16.

In one embodiment, the first metal layer 16 may be composed of Ni, Co, Ti, Pt or combinations and alloys thereof at well as multilayers thereof. In one embodiment, the first metal layer 16 may have a thickness ranging from about 5 nm to about 20 nm. In another embodiment, the first metal layer 16 may have a thickness ranging from about 8 nm to about 15 nm.

In one embodiment, the first metal layer 16 may be deposited by physical vapor deposition. In one embodiment, physical vapor deposition (PVD) can include plating, sputter deposition, molecular beam epitaxial deposition, or electron beam deposition. In another embodiment, the first metal layer 16 may be deposited by chemical vapor deposition (CVD). Chemical vapor deposition is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes include, but are not limited to: Atmospheric Pressure CVD (APCVD), Low Pressure CVD (LPCVD), Plasma Enhanced CVD (EPCVD), Metal-Organic CVD (MOCVD) and combinations thereof. In one embodiment, the first metal layer 16 may be deposited using a conformal deposition method. The term "conformal" denotes a layer having a thickness that does not deviate from greater than or less than 20% of an average value for the thickness of the layer.

In a following process step, the metal nitride layer 17 is formed atop the first metal layer 16. The metal nitride layer 17 may be composed of TiN, TaN, WN, or combinations and alloys thereof.

In one embodiment, the metal nitride layer 17 may have a thickness ranging from about 3 nm to about 15 nm. In another embodiment, the metal nitride layer 17 may have a thickness ranging from about 4 nm to about 7 nm. In one embodiment, the deposition method of metal nitride layer includes chemical vapor deposition (CVD). In one embodiment, the metal nitride layer 17 is deposited by physical vapor deposition (PVD), which may include but is not limited to: plating, sputter deposition, molecular beam epitaxial deposition, electron beam deposition and combinations thereof. In another embodiment, the metal nitride layer 17 is deposited by chemical vapor deposition (CVD), which may include, but is not limited to: Atmospheric Pressure CVD (APCVD), Low Pressure CVD (LPCVD), Plasma Enhanced CVD (EPCVD), Metal-Organic CVD (MOCVD) and combinations thereof. In one embodiment, the metal nitride layer 17 may be deposited using a conformal deposition method.

In one embodiment, the deposition method for forming the metal nitride layer 17 may include atomic layer deposition (ALD) or pulse CVD. In one embodiment when the metal nitride layer 17 is deposited by pulsed CVD (ALD), nitrogen and metal precursors are pulsed one after each other with optional neutral gas added in between the pulsing steps.

Figure 3:
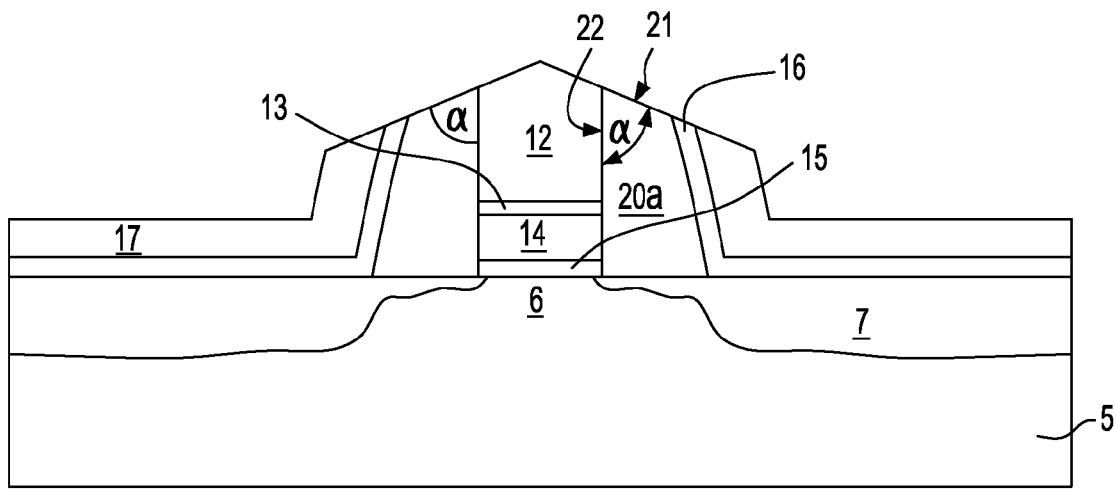
FIG. 3 is a side cross sectional view depicting ion milling/sputtering to remove an upper portion of the upper gate conductor, in accordance with at least one embodiment of the present invention.

FIG. 3 depicts one embodiment of a non-selective anisotropic etch step being applied to the structured depicted in FIG. 2. In one embodiment, the non-selective anisotropic etch step is provided by ion milling, which may also be referred to as sputter etching. Ion milling is a dry etch process. In one embodiment, ion milling includes positioning the substrate 5 containing the gate structure 10 in a vacuum chamber, wherein a stream of argon is introduced into the chamber. Upon entering the chamber, the argon is subjected to a stream of high-energy electrons from a set of anode and cathode electrodes. The electrons ionize the argon atoms to a high-energy state with a positive charge. The substrate 5 is held on a negatively grounded holder, which attracts the ionized argon atoms. As the argon atoms travel to the gate structure 10 they accelerate picking up momentum. At the gate structure 10, the argon atoms contact the upper surface of the upper gate conductor 12 and the at least one dielectric spacer 20 removing material by momentum transfer, as well as the portions of the first metal layer 16 and the metal nitride layer 17 overlying the gate structure 10.

In one embodiment, the angle of incidence of ions impinging on the upper surface of the at least one dielectric spacer 20 is selected to provide an etched spacer 20a having a facetted upper surface 21, which is hereafter referred to as a facetted spacer 20a. In one embodiment, the facetted upper surface 21 is a planar surface, wherein the facet angle α at the intersection of the planar surface 21 to the sidewall 22 of the facetted spacer 20a that is abutting the gate stack 111 is at an acute angle. In one embodiment, the facet angle α is less than 75°. In another embodiment, the facet angle α ranges from about 20 degrees to about 60 degrees. In a further embodiment, the facet angle α ranges from about 25 degrees to about 45 degrees. In another embodiment, the facet angle α is less than 30°.

Figure 4:
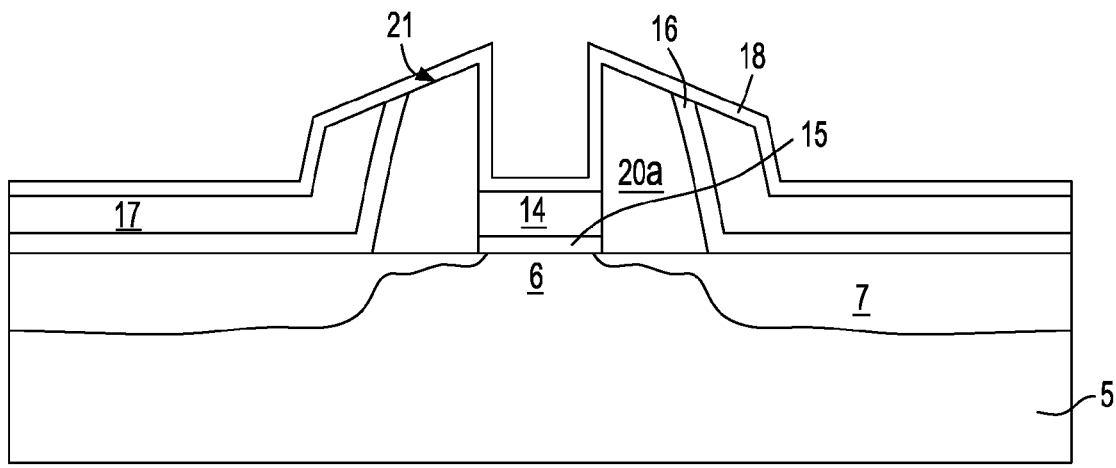
FIG. 4 is a side cross sectional view depicting one embodiment of depositing a second metal layer atop the structure depicted in FIG. 3, in accordance with the present invention.

FIG. 4 depicts removing the upper gate conductor 12 selective to the lower gate conductor 14 and depositing a metal (hereafter referred to as a second metal layer 18) on the lower gate conductor 12, in accordance with one embodiment of the present invention. In one embodiment, removing the upper gate conductor 12 selective to the lower gate conductor 14 includes removing a portion of the upper gate conductor 12 that remains following the above described ion milling step with an etch process selective to the underlying sacrificial dielectric layer 13. Thereafter, the sacrificial dielectric layer 13 is removed by an etch process selective to the lower gate conductor 14, hence exposing the upper surface of the lower gate conductor 14. In one embodiment when the upper gate conductor 12 is composed of polysilicon and the sacrificial dielectric layer 13 is composed of an oxide, such as $SiO_2$, the selective etch of the upper gate conductor 12 may include reactive ion etch with fluoride based gasses, such as $CF_4$, $CF_4/O_4$, $SF_6$, $C_2F_6/O_2$ and $NF_3$. In one embodiment when the sacrificial dielectric layer 13 is composed of an oxide, such as $SiO_2$, and the lower gate conductor 14 is composed of polysilicon, the selective etch of the sacrificial dielectric layer 13 may include wet etch with HF.

Still referring to FIG. 4, in a following process step a second metal layer 18 is formed on at least the lower gate conductor 14. In one embodiment, the second metal layer 18 is formed in direct physical contact with the exposed surface of the lower gate conductor 14. In one embodiment, the second metal layer 18 is deposited by physical vapor deposition that may include, but is not limited to: plating, sputter deposition, molecular beam epitaxial deposition, electron beam deposition and combinations thereof. In another embodiment, the second metal layer 18 is deposited by a chemical vapor deposition (CVD) that may include, but is not limited to: Atmospheric Pressure CVD (APCVD), Low Pressure CVD (LPCVD), Plasma Enhanced CVD (EPCVD), Metal-Organic CVD (MOCVD) and combinations thereof. In one embodiment, the second metal layer 18 is deposited as a conformal layer.

In one embodiment, the second metal layer 18 may be composed of W, Ni, Cu, Co, Pt, Mo, Ti, Ta or multilayers or alloys thereof. In one embodiment, the second metal layer 18 may be deposited to a thickness ranging from about 3 nm to about 30 nm. In another embodiment, the second metal layer 18 may be deposited to a thickness ranging from about 5 nm to about 15 nm.

Figure 5:
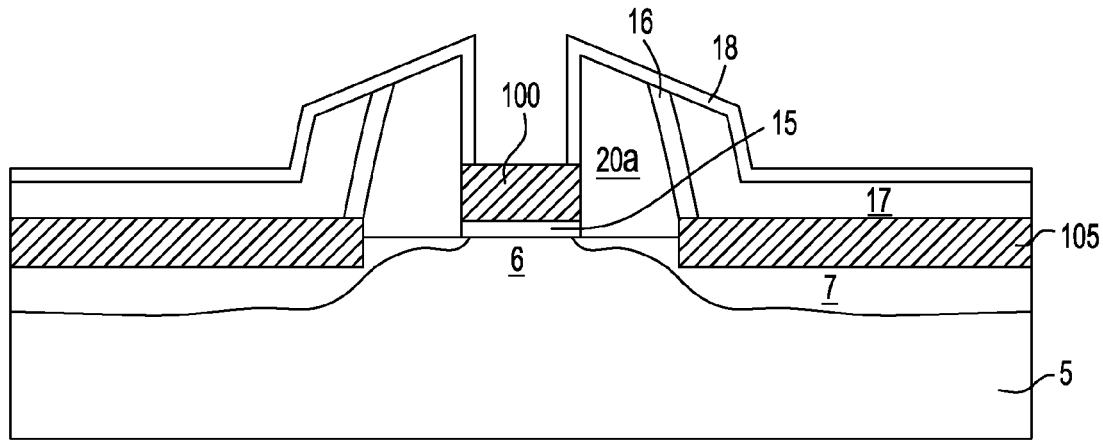
FIG. 5 is a side cross sectional view depicting one embodiment of annealing the structure depicted in FIG. 4 to provide a silicide gate, in accordance with the present invention.

FIG. 5 depicts one embodiment of annealing of the structure depicted in FIG. 4 to provide a metal semiconductor alloy gate 100. In one embodiment, during thermal processing the metal of the second metal layer and the polysilicon of the lower gate conductor 14 intermix forming the metal semiconductor alloy. In one embodiment, the annealing step includes, but is not limited to: rapid thermal processing. In one embodiment, during thermal processing, the second metal layer 18 reacts with the Si of a polysilicon lower gate conductor 14 to provide a metal silicide. In one embodiment when the second metal layer 18 is composed of Ni and the lower gate conductor 14 is composed of polysilicon, the annealing step includes a temperature ranging from approximately 300° C. to approximately 500° C. for a time period ranging from approximately 1 second to approximately 30 seconds to provide a nickel silicide (NiSi or Ni enriched NiSi) gate conductor 100. In another embodiment when the second metal layer 18 is composed of Co, the annealing step includes a temperature ranging from approximately 600° C. to approximately 700° C. for a time period ranging from approximately 1 second to approximately 30 seconds to provide cobalt silicide ($CoSi_2$) gate conductor 100.

In one embodiment, during the alloying of the lower gate conductor 14, silicide contacts 105 (see FIG. 5) form on an upper surface of the source/drain regions 7 of the substrate 5. More specifically, in one embodiment, the metal of the first metal layer 18 reacts with the substrate 5 to provide a metal silicide contact 105 to the source/drain regions 7. In one embodiment when the first metal layer 18 is composed of Ni and the substrate 5 contains Si, a nickel silicide (NiSi) contact 105 forms atop the source/drain regions 7 of the substrate 5. In another embodiment when the first metal layer 18 is composed of Co and the substrate 5 contains Si, a cobalt silicide (NiSi) contact 105 forms atop the source/drain regions 7 of the substrate 5.

Figure 6:
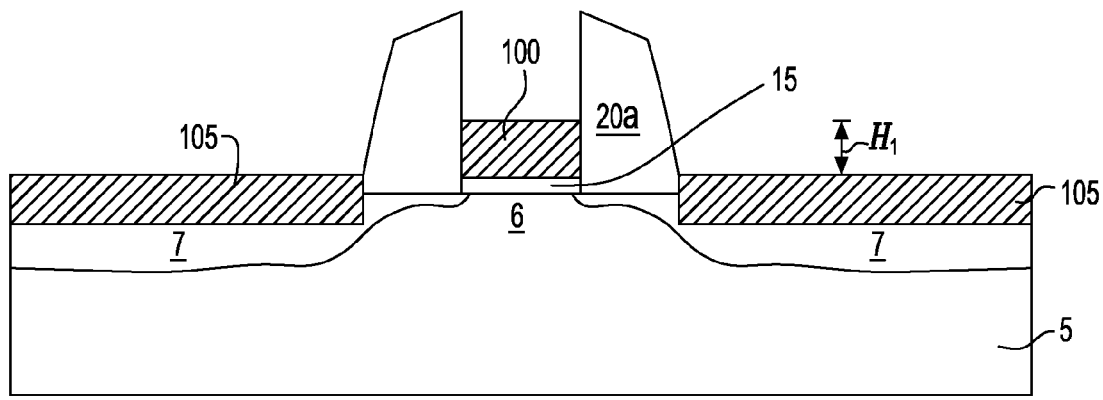
FIG. 6 is a side cross sectional view depicting an etch step to remove un-reacted metals following a silicide forming step, in accordance with the present invention.

FIG. 6 depicts one embodiment of an etch process to remove un-reacted metals following the alloying of the second metal layer 18 with the lower gate conductor 14 and the source/drain regions 7. In one embodiment, the etch process includes a wet etch that removes the unreacted portions of the first metal layer 16, the metal nitride layer 17, and the second metal layer 18 selective to the substrate 5, the facetted spacer 20a, and the silicide gate 100.

In one embodiment, the present invention reduces the gate height of a silicide or metal semiconductor alloy gate conductor following spacer 20 and source/drain region 7 formation, without requiring chemical mechanical polishing to planarize the gate conductor 14. In one embodiment, the present invention provides a height $H_1$ ranging from about 10 nm to about 50 nm. In another embodiment, the present invention provides a silicide gate height $H_1$ ranging from about 20 nm to about 30 nm. In a further embodiment, the present invention provides a gate height $H_1$ ranging from about 25 nm to about 30 nm.

Figure 7:
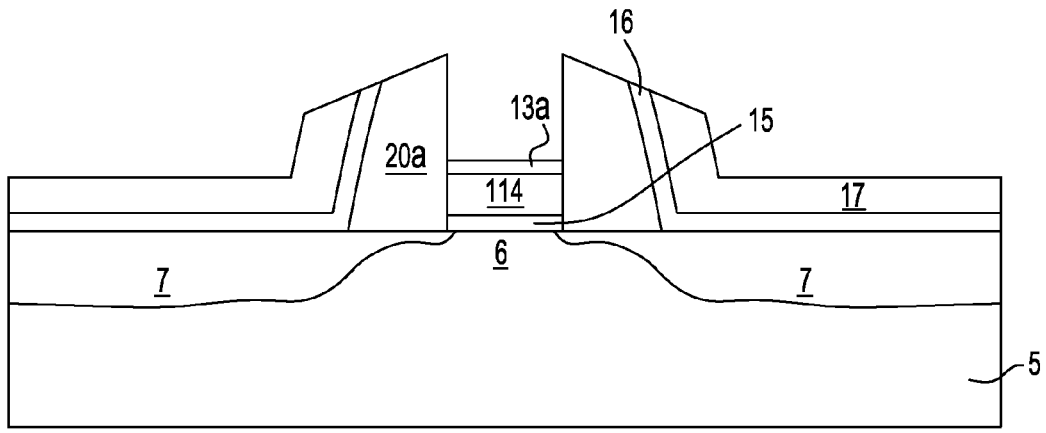
FIG. 7 is a side cross sectional view depicting an etch sequence applied to the structure depicted in FIG. 3 to remove the upper gate conductor selective to a dielectric layer positioned atop a metal gate, in accordance with at least one embodiment of the present invention.
Figure 8:
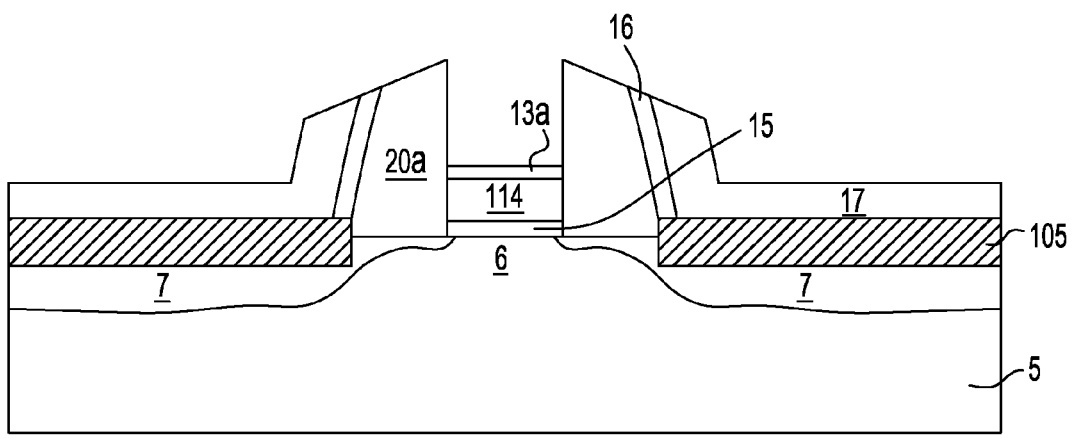
FIG. 8 is a side cross sectional view depicting an annealing process applied to the structure depicted in FIG. 7 in order to produce a contact silicide, in accordance with one embodiment of the present invention.
Figure 9:
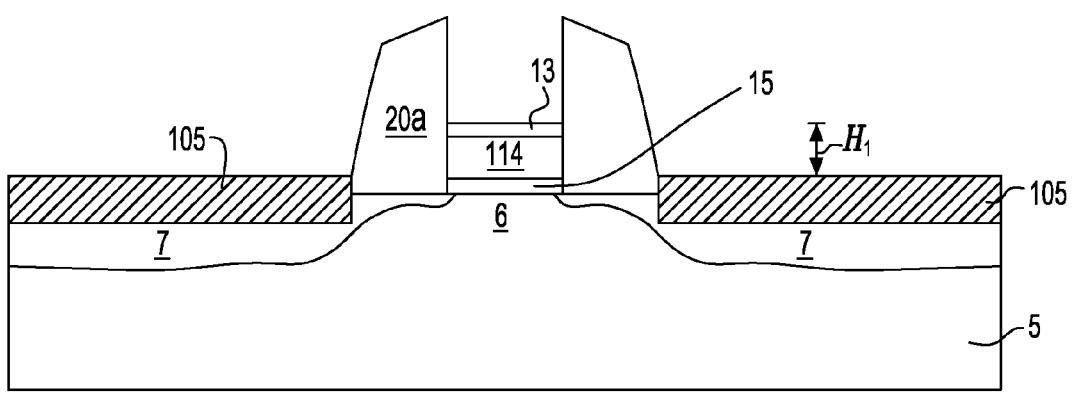
FIG. 9 is a side cross sectional view depicting an etch step to remove the un-reacted metal following the silicidation depicted in FIG. 8, in accordance with the one embodiment of the present invention.

FIGS. 7 to 9 depict another embodiment of the present method for forming a semiconducting device, such as a MOSFET, including a metal gate structure. In one embodiment, the method begins with a structure similar to the structure depicted in FIG. 1. Differentiated from the embodiment described above with reference to FIGS. 1 to 6, in this embodiment the initial structure includes a lower gate conductor 114 that is composed of a metal, hence providing a metal gate. Suitable metals for the lower gate conductor 114 include Ti, TiN, Ta, W, Co, Ni, Pt, Pd or alloys thereof. In one embodiment, the lower gate conductor 114 is atop a gate dielectric 15 composed of a high-k gate dielectric. The high-k gate dielectric may be composed of an insulating material having a dielectric constant of greater than about 4.0. In another embodiment, the high-k gate dielectric has a dielectric constant greater than about 7.0. In one embodiment, the high-k gate dielectric employed in the present invention includes, but not limited to: an oxide, nitride, oxynitride and/or silicate including metal silicates and nitrided metal silicates. In one embodiment, it is preferred that the gate dielectric 15 includes a high k dielectric comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. In one embodiment, the lower gate conductor 114 is composed of TiN and the gate dielectric 15 is composed of $HfO_2$.

The process flow described above with reference to FIGS. 1-3 is applicable to the present embodiment of the invention, with the exception of the lower gate conductor 114 being composed of a metal, as opposed to polysilicon.

Following ion milling of the structure depicted in FIG. 3, an etch step is performed to remove the upper gate conductor 12, as depicted in FIG. 7. In one embodiment, the upper gate conductor 12 may be removed by a selective etch process that removes the upper gate conductor 12 selective to the dielectric layer 13a, wherein the dielectric layer 13a functions as an etch stop. In one embodiment when the upper gate conductor 12 is composed of polysilicon and the dielectric layer 13a is composed of an oxide, such as silicon oxide, the etch process may include reactive ion etch including fluoride based gasses, such as $CF_4$, $CF_4/O_4$, $SF_6$, $C_2F_6/O_2$ and $NF_3$.

FIG. 8 depicts an annealing process applied to the structure depicted in FIG. 7 in order to produce a silicide contact 105 to the source/drain regions 7. In one embodiment, the annealing step includes, but is not limited to, rapid thermal processing. In one embodiment, the metal of the first metal layer 16 reacts with the substrate 5 to provide a metal silicide contact 105 to the source/drain regions 7. In one embodiment when the first metal layer 16 is composed of Ni and the substrate 5 contains Si, a nickel silicide (NiSi) contact 105 forms atop the source/drain regions 7 of the substrate 5. In one embodiment when the first metal layer 16 is composed of Ni, the annealing step includes a temperature ranging from approximately 300° C. to approximately 500° C. for a time period ranging from approximately 1 second to approximately 30 seconds to provide nickel silicide (NiSi) contacts 105. In another embodiment when the first metal layer 16 is composed of Co, the annealing step includes a temperature ranging from approximately 600° C. to approximately 700° C. for a time period ranging from approximately 1 second to approximately 30 seconds to provide cobalt silicide ($CoSi_2$) contacts 105.

FIG. 9 depicts an etch step to remove the un-reacted metal following the silicidation depicted in FIG. 8, in accordance with the one embodiment of the present invention. In one embodiment, the etch process includes a wet etch that removes the unreacted portions of the first metal layer 16, the metal nitride layer 17, and the second metal layer 18 selective to the substrate 5, the facetted spacer 20a, and the silicide gate 100. In one embodiment, the wet etch chemistry may include sulferic per-oxide or aqua-regia.

In one embodiment, the present invention reduces the metal gate height $H_1$ following spacer 20 and source/drain region 7 formation, without requiring that chemical mechanical polishing planarize the metal gate conductor 114. In one embodiment, the present invention provides a metal gate height $H_1$ ranging from about 10 nm to about 50 nm. In another embodiment, the present invention provides a metal gate height $H_1$ ranging from about 20 nm to about 30 nm. In a further embodiment, the present invention provides a metal gate height $H_1$ ranging from about 25 nm to about 30 nm.

While the present invention has been particularly shown and described with respect to the preferred embodiments thereof, it will be understood by those skilled in the art that the foregoing and other changes in forms of details may be made without departing from the spirit and scope of the present invention. It is therefore intended that the present invention not be limited to the exact forms and details described and illustrated, but fall within the scope of the appended claims.

What is claimed:

1. A method of fabricating a device comprising:
   providing a semiconducting device comprising a gate structure atop a substrate, the gate structure comprising a dual gate conductor including an upper gate conductor and a lower gate conductor, wherein at least the lower gate conductor comprises a silicon containing material;
   forming a contact metal layer on the upper surface of the semiconducting device;
   forming a metal nitride layer on the contact metal layer;
   removing a portion of the metal nitride layer overlying the gate structure, a portion of the contact metal layer overlying the gate structure and an upper portion of the upper gate conductor with a substantially non-selective material removal process;

removing a remaining portion of the upper gate conductor selective to the lower gate conductor;
depositing a metal on at least the lower gate conductor; and
producing a silicide from the metal and the lower gate conductor.

2. The method of claim 1, wherein the dual gate conductor comprises:
a sacrificial dielectric layer positioned between the upper gate conductor and the lower gate conductor;
a gate dielectric positioned between the lower gate conductor and the substrate; and at least one dielectric spacer adjacent to the sidewall of the dual gate conductor.

3. The method of claim 2, wherein the substantially non-selective material removal process is substantially isotropic.

4. The method of claim 3, wherein the substantially isotropic and substantially non-selective material removal process comprises ion milling.

5. The method of claim 3, wherein the removing of the remaining portion of the upper gate conductor and the sacrificial dielectric layer comprises:
removing a remaining portion of the upper gate conductor selective to the sacrificial dielectric layer positioned between the upper gate conductor and the lower gate conductor; and
removing the sacrificial dielectric layer positioned between the upper gate conductor and the lower gate conductor selective to the lower gate conductor.

6. The method of claim 1, wherein the metal comprises Ni, Co, Ti, or Pt.

7. The method of claim 1, wherein the producing of the silicide from the metal and the lower gate conductor comprises annealing.

8. The method of claim 1, wherein the metal comprises Ni and the producing of the silicide from the metal and the lower gate conductor comprises annealing at a temperature of approximately 300° C. to approximately 500° C. for a time period ranging from 1 seconds to 30 seconds.

9. The method of claim 1, wherein the silicide comprises NiSi, Ni enriched NiSi, $NiSi_2$, $TiSi_2$, $CoSi_2$, $MoSi_2$, $PtSi_2$, $TaSi_2$, or WSi.

10. A method of fabricating a device comprising:
providing a semiconducting device comprising a substrate, a dual gate conductor atop the substrate, and dopant regions in the substrate substantially corresponding to sidewalls of the dual gate conductor, the dual gate conductor including an upper gate conductor, a dielectric layer and a lower gate conductor, wherein the lower gate conductor is a metal gate;
forming a contact metal layer on the dopant regions and the dual gate conductor;
forming a metal nitride layer on the contact metal layer and the dual gate conductor;
removing a portion of the metal nitride layer overlying the dual gate conductor, a portion of the contact metal layer overlying the dual gate conductor and an upper portion of the upper gate conductor with a substantially non-selective material removal process;
removing a remaining portion of the upper gate conductor selective to the dielectric layer; and
producing a silicide from the contact metal layer and the dopant regions.

11. The method of claim 10, wherein the dual gate conductor further comprises and a gate dielectric positioned between the lower gate conductor and the substrate.

12. The method of claim 10, wherein the substantially non-selective material removal process is substantially isotropic.

13. The method of claim 12, wherein the substantially isotropic and substantially non-selective material removal process comprises ion milling.

14. The method of claim 12, wherein the removing of the remaining portion of the upper gate conductor to expose the dielectric layer comprises an etch process that removes the remaining portion of the upper gate conductor selective to the dielectric layer.

15. The method of claim 10, wherein the silicide comprises NiSi, Ni enriched NiSi, $NiSi_2$, $CoSi_2$, $TiSi_2$, $WSi$, $TaSi_2$, PtSi, or $MoSi_2$.

* * * * *